US010952322B2

(12) United States Patent
Hengel et al.

(10) Patent No.: US 10,952,322 B2
(45) Date of Patent: Mar. 16, 2021

(54) INTEGRATED ELECTRONIC CONTROL UNIT FOR A STEERING WHEEL ASSEMBLY

(71) Applicant: Joyson Safety Systems Acquisition LLC, Auburn Hills, MI (US)

(72) Inventors: Molly Hengel, Auburn Hills, MI (US); Ryan Jacewicz, Auburn Hills, MI (US); Phil Maguire, Auburn Hills, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 8 days.

(21) Appl. No.: 16/427,086

(22) Filed: May 30, 2019

(65) Prior Publication Data
US 2019/0373728 A1    Dec. 5, 2019

Related U.S. Application Data

(60) Provisional application No. 62/677,868, filed on May 30, 2018.

(51) Int. Cl.
*H05K 7/00*       (2006.01)
*H05K 1/11*       (2006.01)
(Continued)

(52) U.S. Cl.
CPC ............ *H05K 1/119* (2013.01); *B60R 16/027* (2013.01); *B62D 1/046* (2013.01); *H01R 12/716* (2013.01);
(Continued)

(58) Field of Classification Search
CPC .............. H05K 1/119; H05K 1/18; H05K 2201/09063; H05K 2201/09072;
(Continued)

(56) References Cited

U.S. PATENT DOCUMENTS 3,544,743 A * 12/1970 Asano ................ B60Q 1/1484
                                                  200/61.54
6,147,315 A * 11/2000 Rudolph ............... B60Q 5/003
                                                  200/61.54
(Continued)

FOREIGN PATENT DOCUMENTS

EP           0887234 B1    12/1998
KR        20130070694 A     6/2013

OTHER PUBLICATIONS

International Search Report and Written Opinion dated Aug. 22, 2019, from International Application No. PCT/US2019/034705, 9 pages.

*Primary Examiner* — Yuriy Semenenko
(74) *Attorney, Agent, or Firm* — Meunier Carlin & Curfman LLC

(57) ABSTRACT

A vehicle steering wheel assembly includes a steering wheel frame having a rim portion and a hub portion within the rim portion. The hub has a first surface facing a rear of the vehicle and a second surface facing a front of the vehicle. An electronic control unit (ECU) has a first surface facing the rear of the vehicle located in a plane that is disposed between a second plane that includes the second surface of the hub and the front of the vehicle. An electrical connector extends from the first surface of the ECU towards the first surface of the hub portion. The ECU comprises a clock spring connector electrically coupled to the electrical connector via a wire trace. By incorporating wire traces that provide electrical connections between the electrical connectors and the clock spring connector, the ECU reduces the size and/or number of wire harnesses used in the steering wheel assembly.

20 Claims, 9 Drawing Sheets

(51) Int. Cl.
*H05K 1/18* (2006.01)
*H01R 12/71* (2011.01)
*B62D 1/04* (2006.01)
*B60R 16/027* (2006.01)
*H01R 27/02* (2006.01)

(52) U.S. Cl.
CPC ............... *H05K 1/18* (2013.01); *H01R 27/02* (2013.01); *H01R 2201/26* (2013.01); *H05K 2201/09027* (2013.01); *H05K 2201/09063* (2013.01); *H05K 2201/09072* (2013.01); *H05K 2201/09227* (2013.01); *H05K 2201/10189* (2013.01); *H05K 2201/2018* (2013.01)

(58) Field of Classification Search
CPC .......... H05K 2201/09227; H05K 2201/10189; H05K 2201/2018; H05K 2201/09027; H05K 1/181; H05K 2201/10356; H01R 12/716; H01R 2201/26; H01R 27/02; B62D 1/046; B60R 16/027
See application file for complete search history.

(56) References Cited

U.S. PATENT DOCUMENTS

| | | | |
|---|---|---|---|
| 6,403,899 B1 * | 6/2002 | Fitzpatrick | B60Q 1/1461 200/61.27 |
| 6,907,328 B2 * | 6/2005 | Fehr | B60K 35/00 701/29.1 |
| 7,029,284 B2 * | 4/2006 | Khoury | B60Q 1/0082 439/15 |
| 9,812,808 B2 | 11/2017 | Xu et al. | |
| 2004/0095739 A1 * | 5/2004 | Parker | B60Q 3/14 362/23.16 |
| 2012/0283914 A1 * | 11/2012 | Karwaczynski | B62D 1/046 701/41 |

* cited by examiner

INTEGRATED ELECTRONIC CONTROL UNIT FOR A STEERING WHEEL ASSEMBLY

CROSS-REFERENCE TO RELATED APPLICATIONS

This application claims the benefit of priority to Application No. 62/677,868, filed May 30, 2018, the disclosure of which is incorporated herein by reference in its entirety.

BACKGROUND

Increasing numbers of electrical components are incorporated into steering wheel assemblies. These electrical components are typically connected to car electronics using one or more wire harnesses. Wire harnesses are messy, large, and inconsistently routed inside steering wheels. Wires can get pinched or interfere with a driver airbag in the steering wheel during assembly and upon activation of a horn through the steering wheel. In addition to the increased number of electrical components, the size of steering wheels is trending smaller leading to even greater challenges with efficiently packaging electrical connections.

SUMMARY

Various aspects of the disclosure provide a vehicle steering wheel assembly. The steering wheel assembly comprises a steering wheel frame having a rim portion and a hub portion located centrally to the rim portion, the hub portion having a first surface facing a rear of the vehicle and a second surface facing a front of the vehicle. The steering wheel assembly also comprises an electronic control unit having a first surface facing the rear of the vehicle, wherein the first surface of the electronic control unit is located in a plane that is disposed between a second plane that includes the second surface of the hub portion and the front of the vehicle. An electrical connector extends from the first surface of the electronic control unit towards the first surface of the hub portion.

In some aspects of the disclosure, the electronic control unit comprises a clock spring connector electrically coupled to the electrical connector. In some aspects of the disclosure, the clock spring connector is electrically coupled to the electrical connector via a processor on the electronic control unit. In some aspects of the disclosure, the clock spring connector is electrically coupled to the electrical connector via a wire trace.

In any of the above aspects of the disclosure, the electronic control unit comprises a printed circuit board with the electrical connector and the clock spring connector. In some aspects of the disclosure, the printed circuit board is overmolded with a polymer.

In any of the above aspects of the disclosure, the clock spring connector extends from the first surface of the electronic control unit towards the first surface of the hub portion. The electronic control unit comprises an aperture, wherein the clock spring connector is arranged to pass through the aperture towards the second surface of the electronic control unit. The hub portion comprises a second aperture in alignment with the aperture, and wherein the clock spring connector is further arranged to pass through the second aperture.

In any of the above aspects of the disclosure, the first surface of the electronic control unit is coupled to the second surface of the hub portion.

In any of the above aspects of the disclosure, the electrical connector extends from the first surface of the electronic control unit at a location beyond a perimeter of the hub portion.

In any of the above aspects of the disclosure, the electrical connector extends from the first surface of the electronic control unit at a location in alignment with an opening defined by the hub portion.

In any of the above aspects of the disclosure, the electronic control unit comprises an integrated horn switch.

In any of the above aspects of the disclosure, the first surface of the electronic control unit faces the second surface of the hub portion.

In any of the above aspects of the disclosure, a connection pin of the electrical connector extends in a direction parallel to the first surface of the electronic control unit.

In any of the above aspects of the disclosure, the electronic control unit comprises a plurality of connectors configured to be coupled to an external clock spring connector.

Various other aspects of the disclosure provide an electronic control unit for a steering wheel assembly. The electronic control unit comprises a printed circuit board defining an aperture extending therethrough. The electronic control unit also comprises an electrical connector that extends from a first surface of the printed circuit board. The electronic control unit also comprises a clock spring connector electrically coupled to the electrical connector by the printed circuit board, wherein the clock spring connector extends from a first surface of the printed circuit board and is arranged to pass through the aperture.

In some aspects of the disclosure, the printed circuit board further comprises a boss extending from the first surface of the printed circuit board. The threaded boss is sized to be received by a mounting hole defined by a hub plate of the steering wheel assembly.

In some aspects of the disclosure, the printed circuit board further comprises a ground connection area about the boss for electrical connection with the hub plate upon assembly.

In any of the above aspects of the disclosure, the printed circuit board is sized to include a portion of the first surface that extends beyond a perimeter of a hub plate of the steering wheel assembly when mounted thereto. The electrical connector is positioned on the portion of the first surface of the printed circuit board.

In any of the above aspects of the disclosure, the printed circuit board comprises an integrated horn switch.

In any of the above aspects of the disclosure, the clock spring connector is electrically connected to the electrical connector via a wire trace on the printed circuit board.

Various other aspects of the disclosure provide an electronic control unit for a steering wheel assembly. The electronic control unit comprises a printed circuit board defining an aperture extending therethrough. The electronic control unit comprises an electrical connector that extends from a first surface of the printed circuit board. The electronic control unit comprises a plurality of connectors that extend from the first surface of the printed circuit board and are configured to receive power and/or data from a clock spring connector. The electrical connector is electrically coupled to one of the plurality of connectors by the printed circuit board. The aperture comprises a first aperture area arranged to be aligned with a clock spring of a vehicle.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
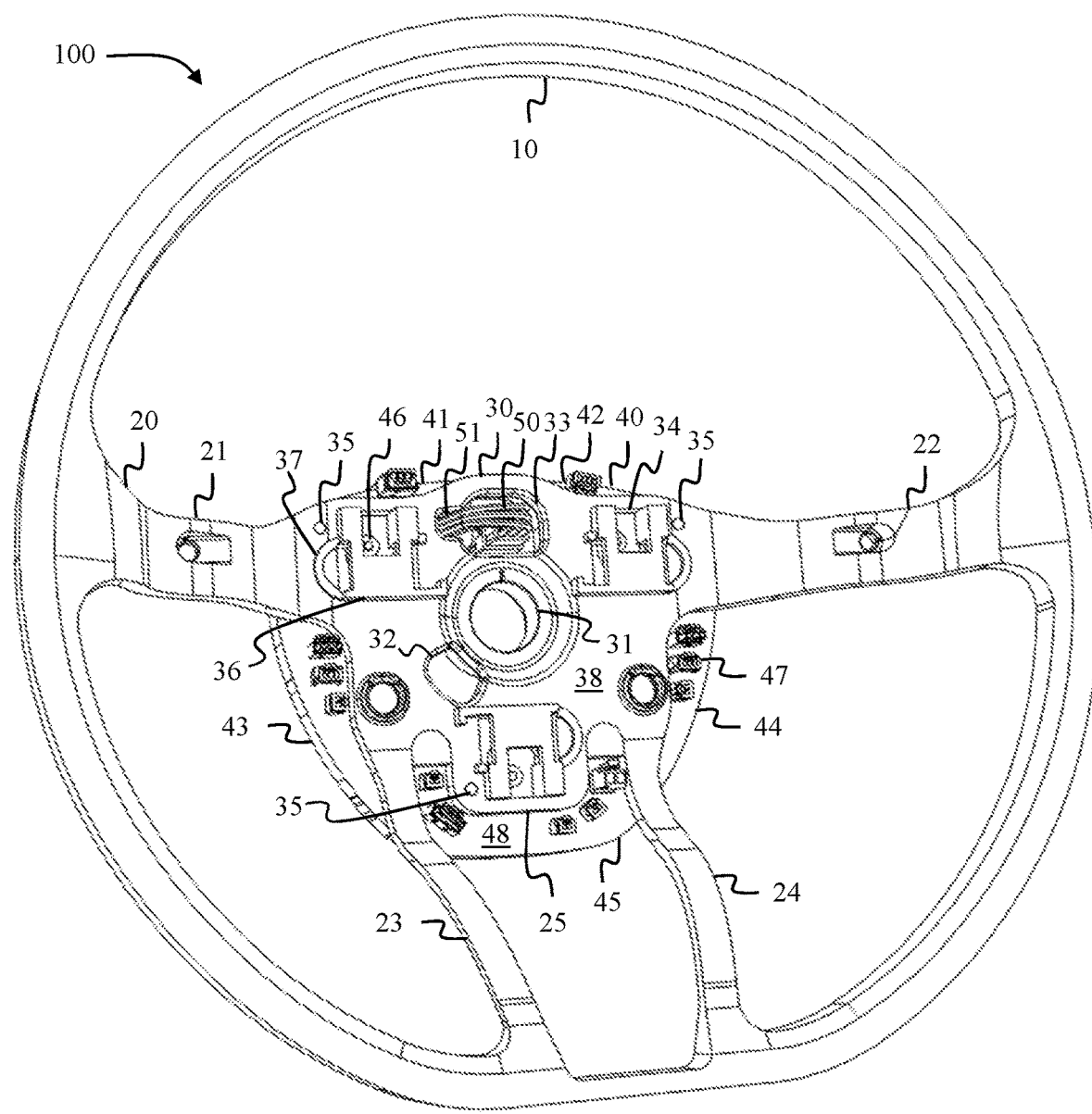
FIG. 1 is a front perspective view of an example steering wheel assembly with an integrated electronic control unit according to one implementation.

It should be understood at the outset that although illustrative implementations of one or more embodiments are illustrated below, the disclosed systems and methods may be implemented using any number of techniques, whether or not currently known or in existence. The disclosure should in no way be limited to the illustrative implementations, drawings, and techniques illustrated below, but may be modified within the scope of the appended claims along with their full scope of equivalents. Use of the phrase "and/or" indicates that any one or any combination of a list of options can be used. For example, "A, B, and/or C" means "A", or "B", or "C", or "A and B", or "A and C", or "B and C" or "A and B and C".

An integrated electronic control unit (ECU) is provided herein with electrical connectors extending from a first surface of the ECU. Each of the electrical connectors is for connecting with a corresponding electrical or electronic component used in a steering wheel assembly, collectively referred to throughout the disclosure as electrical components. The ECU includes a clock spring connector connected to a printed circuit board (PCB). The PCB includes wire traces that electrically connect one or more of the electrical connectors to each other and/or the clock spring connector. The ECU may include one or more processors between one of the electrical connectors and the clock spring connector. Accordingly, the ECU integrates the electrical connections for the electrical components of a steering wheel assembly as opposed to using wire harnesses. The PCB may additionally integrate one or more electrical components used in the steering wheel assembly. For example, the integrated electrical components of the PCB may include an integrated horn switch. By incorporating wire traces that provide electrical connections between the electrical connectors and the clock spring connector, the ECU reduces the size and/or number of wire harnesses used in the steering wheel assembly. In some implementations, wire harnesses in the steering wheel assembly may be eliminated altogether and instead simple wire leads from electrical components of the steering wheel assembly are directly connected to the electrical connectors of the ECU.

The steering wheel assembly includes a hub plate having a first surface configured to face a rear of a vehicle and a second surface configured to face a front of the vehicle. The ECU is configured to be mounted to a steering wheel hub plate between a back cover of the steering wheel assembly and the hub plate, such that the first surface of the ECU faces the second surface of the hub. In some implementations, the ECU is configured to be mounted flush with the back cover of the steering wheel assembly. In other words, the ECU is configured to be mounted towards the front of the vehicle from the hub plate or behind the hub plate, from the perspective of a driver. By mounting the ECU to the back of the hub plate, the electrical connections for the electrical components of the steering wheel assembly are routed away from the driver airbag module and thereby avoid interference.

When the ECU is mounted to the hub plate, the electrical connectors extend from the first surface of the ECU towards the first surface of the hub plate—towards the rear of the vehicle. Because a clock spring for the vehicle is located towards the front of the vehicle from the hub plate, the ECU includes an aperture through which the clock spring connector is configured to pass through to connect to the clock spring. In other words, the clock spring connector is arranged to pass through the aperture towards the second surface of the ECU. Additionally, because the ECU is mounted to the back of the hub plate, the ECU includes one or more areas that extend beyond a perimeter of the hub plate. Each of the areas includes one or more of the electrical connectors that extend from the first surface of the ECU.

Figure 2:
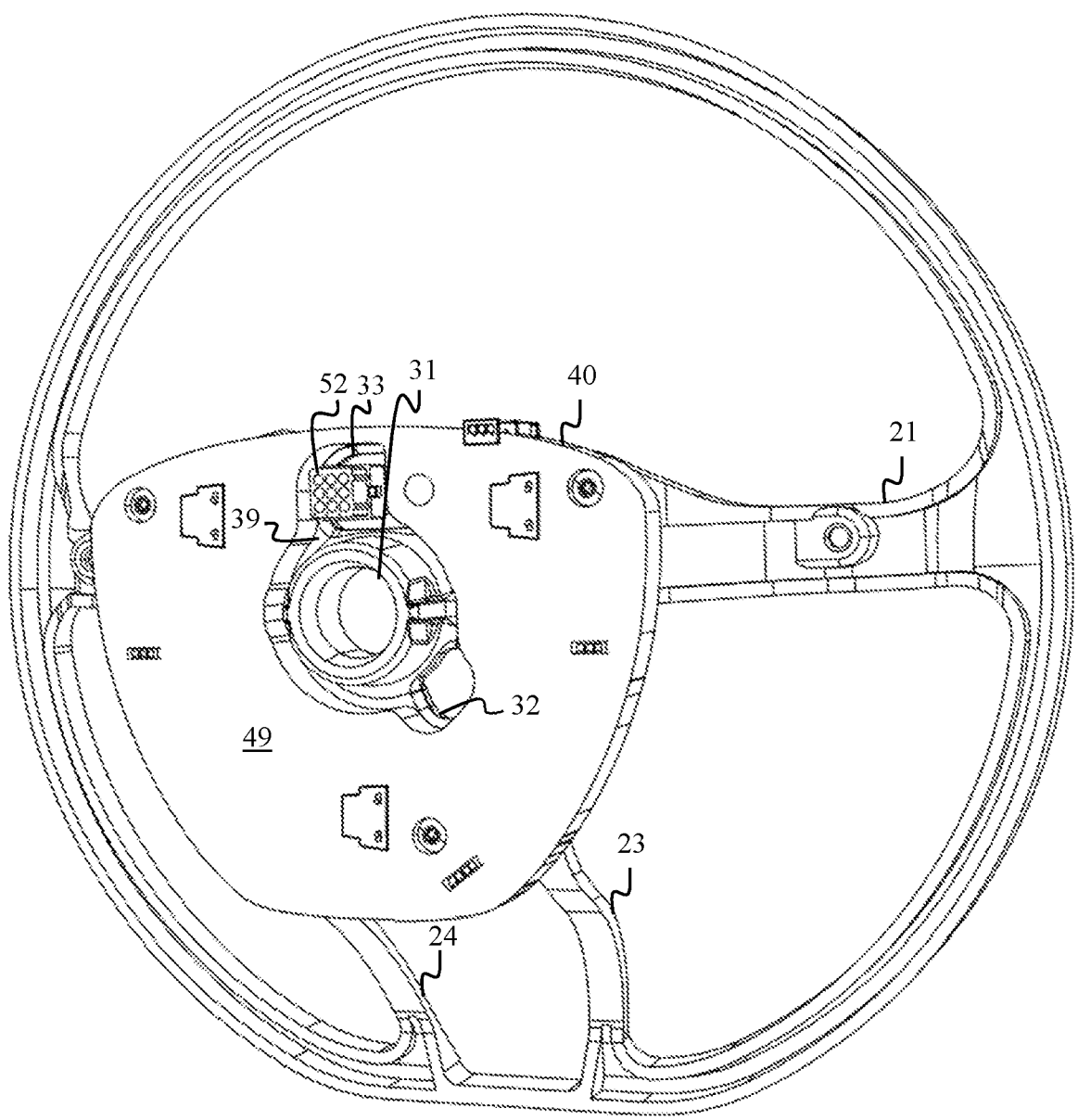
FIG. 2 is a rear perspective view of the example steering wheel assembly with the integrated electronic control unit shown in FIG. 1.
Figure 3:
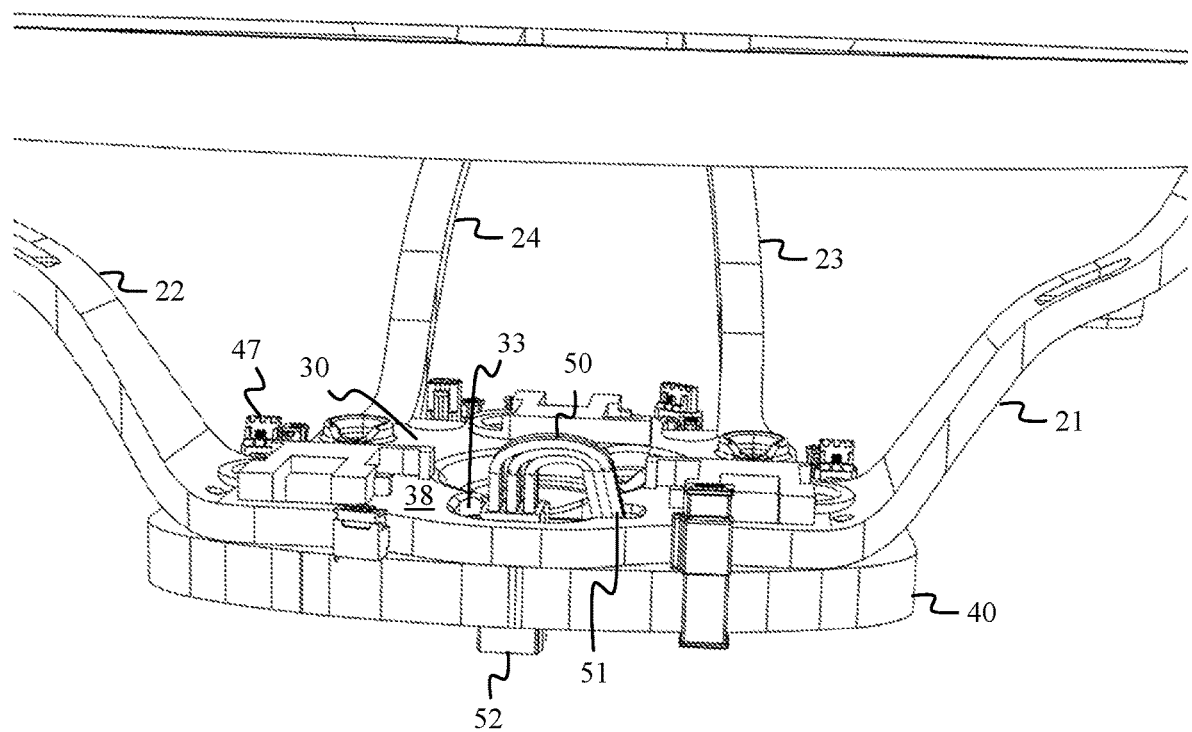
FIG. 3 is top perspective view of the example steering wheel assembly with the integrated electronic control unit shown in FIG. 1.

FIGS. 1-3 show various views of an example steering wheel assembly 100 with an integrated electronic control unit (ECU) 40. The steering wheel assembly 100 includes a rim 10 and spokes 20 that connect the rim 10 to a hub plate 30. In the example shown in FIG. 1, the spokes 20 include a first spoke 21, a second spoke 22, a third spoke 23, and a fourth spoke 24. The first spoke 21 connects a first side of the hub plate 30 to the rim 10. The second spoke 22 connects a second side of the hub plate 30 opposite to the first side of the hub plate 30 to the rim 10. The third and fourth spokes 23, 24 connect a third side of the hub plate 30 to the rim. The third and fourth spokes 23, 24 define a saddle 25 of the hub plate 30 therebetween.

The hub plate 30 includes a central portion of the hub plate 31 that defines an opening configured to couple the steering wheel assembly 100 to a steering column (not shown) of a vehicle. The central portion of the hub plate 31 defines an opening through the hub plate 30. The hub plate 30 also includes a first aperture 32 therethrough configured to receive squib wires for a driver side air bag (DAB) (not shown). The hub plate 30 also includes a second aperture 33 therethrough, described in more detail below. The second aperture 33 of the hub plate 30 is configured to align with a clock spring (not shown) on the steering column. The hub plate 30 also includes one or more third apertures 34, each configured to align with an electrical connector or an integrated electrical component 46 of the ECU 40. For example, in some implementations, the integrated electrical component 46 may be an integrated horn switch. The hub plate 30 also includes a plurality of mounting holes 35 for mounting the ECU 40 to the hub plate 30. The mounting holes 35 may be sized to receive a screw, bolt, or other mechanical fastener. The hub plate 30 also includes a plurality of air bag brackets 36 and air bag hooks 37 configured to attach a DAB to the hub plate 30.

The hub plate 30 has a first surface 38 and a second surface 39. The first surface 38 of the hub plate 30 is configured to face a rear of a vehicle when installed therein (e.g., upon mounting the central portion of the hub plate 31 to the steering column). Likewise, the first surface 38 is a surface of the hub plate 30 upon which the DAB is configured to be installed. Similarly, the second surface 39 of the hub plate 30 is opposite from the first surface 38 of the hub plate 30 and is configured to face a front of the vehicle when installed therein.

The ECU 40 includes a plurality of areas 41-45 that extend beyond a perimeter of the hub plate 30. The areas 41-45 may each extend into an area defined between two of the spokes 20, when assembled. For example, the area 41 and the area 42 extend beyond a perimeter of the hub plate 30 into an area between the first spoke 21 and the second spoke 22. The area 43 extends beyond a perimeter of the hub plate 30 into an area between the first spoke 21 and the third spoke 23. The area 44 extends beyond a perimeter of the hub plate 30 into an area between the second spoke 22 and the fourth spoke 24. The area 45 extends beyond a perimeter of the hub plate 30 into an area between the third spoke 23 and the fourth spoke 24. The area 45 extends around the saddle 25 defined by the hub plate 30 between the third spoke 23 and the fourth spoke 24.

Each of the areas 41-45 includes one or more electrical connectors 47. The electrical connectors 47 may include one or more of a vehicle cabin monitoring system connector, a light bar connector, a switch connector for connecting to a switch (not shown) on the steering wheel assembly 100, a hand sensor connector, a vibrational actuator connector, a microphone connector, a connector to one or more components of a hand sensor assembly, a lighted emblem connector, a heater connector, and/or a negative temperature coefficient (NTC) thermistor. The list of electrical connectors 47 is not intended to be exhaustive and other types of connectors for other electrical components of a steering wheel assembly may be used. More or fewer electrical connectors 47 may be used. As noted above, one or more electrical components 46 may be integrated into the ECU 40, such as a horn switch.

The ECU 40 includes a clock spring connector 50, which includes a wire bundle 51 connected to the first surface 48 of the ECU 40 and a female connector 52. As best seen in FIG. 2, the female connector 52 includes a plurality of recesses adapted to receive corresponding pins of the clock spring. In some implementations, the clock spring connector 50 may have a male connector with pins for engaging with corresponding recesses of the clock spring.

Each of the electrical connectors 47 and the clock spring connector 50 extend from a first surface 48 of the ECU 40. The first surface 48 of the ECU 40 is configured to face a rear of a vehicle when installed therein (e.g., upon mounting to the hub plate 30). Similarly, a second surface 49 of the ECU 40 is opposite from the first surface 48 of ECU 40 and is configured to face a front of the vehicle when installed therein. In some implementations, the first surface 48 of the ECU 40 lies in a plane that is parallel to a plane in which the first surface 38 of the hub plate 30 lies. Likewise, in such implementations, the second surface 49 of the ECU 40 lies in a plane that is parallel to a plane in which the second surface 39 of the hub plate 30 lies.

Figure 4:
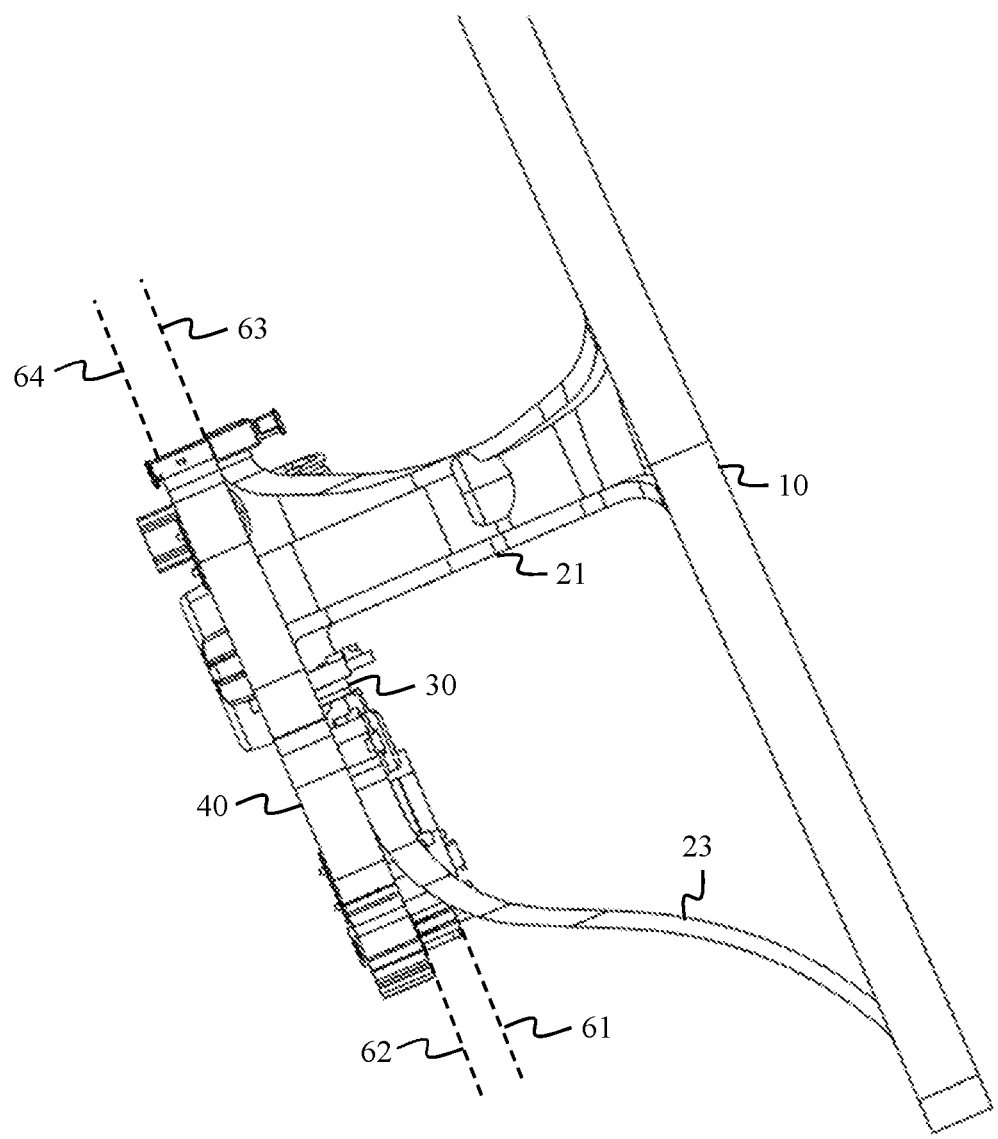
FIG. 4 is a left side view of the example steering wheel assembly with the integrated electronic control unit shown in FIG. 1.

FIG. 4 is a left side view of the example steering wheel assembly 100 with the integrated electronic control unit 40.

As shown, the first surface 38 of the hub plate 30 is located in a first plane 61 and the second surface 39 of the hub plate 30 is located in a second plane 62. Likewise, the first surface 48 of the ECU 40 is located in a third plane 63 and the second surface 49 of the ECU 40 is located in a fourth plane 64. Therefore, the first surface 48 of the electronic control unit 40, which is located in the third plane 63, is disposed between the second plane 62, which includes the second surface 39 of the hub plate 30, and the front of a vehicle or a back cover (not shown) of the steering wheel assembly 100. Accordingly, the first surface 48 of the electronic control unit 40 faces the second surface 39 of the hub plate 30. In other words, the first surface 48 of the electronic control unit 40 is configured to be located towards a front of the vehicle from the first surface 38 of the hub plate 30, which in turn is configured to face towards a rear of the vehicle. In the example shown in FIG. 4, the second plane 62 is parallel to and coincident with the third plane 63. In other words, the first surface 48 of the ECU 40 is located towards the front of the vehicle from the first surface 38 of the hub plate 30, or the first surface 48 of the ECU 40 is configured to be coupled to the second surface 39 of the hub plate 30, which in turn is configured to face towards a front of the vehicle.

Figure 5:
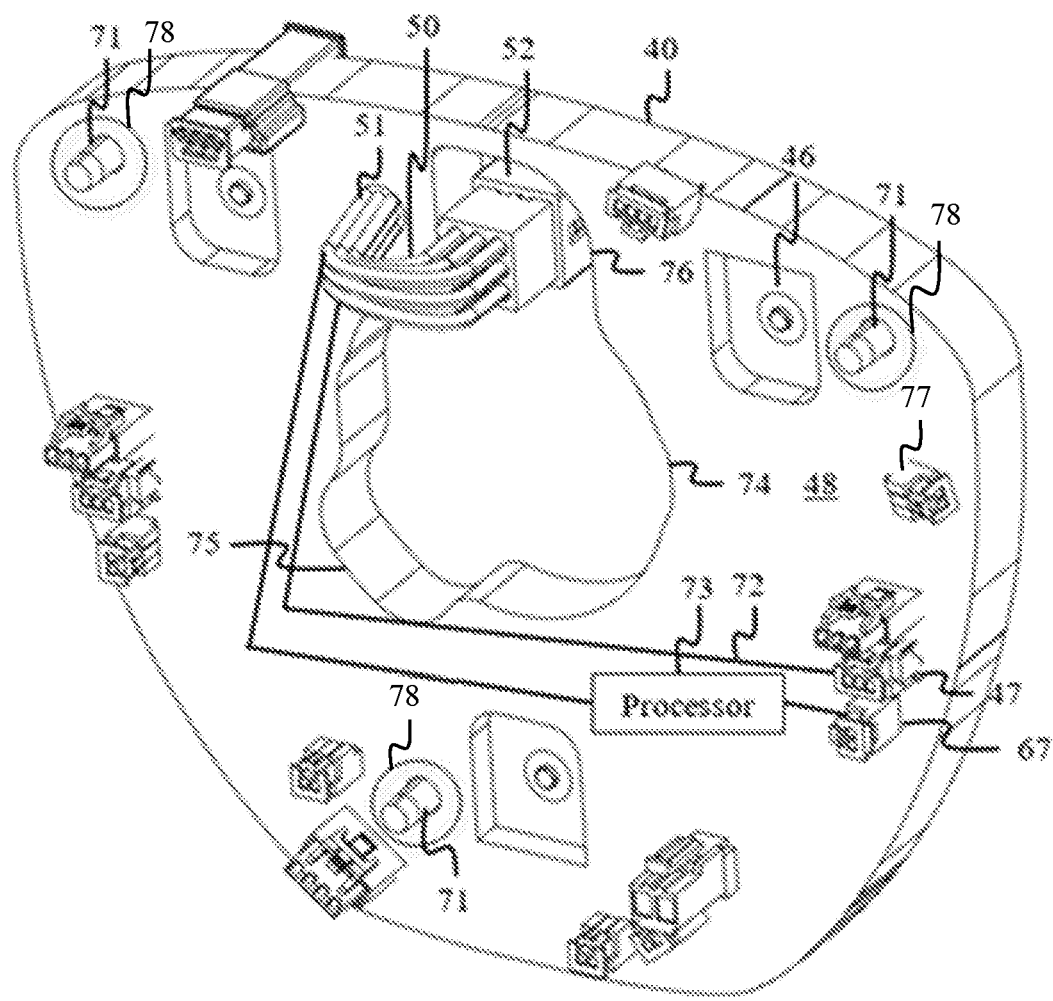
FIG. 5 is a front perspective view of the integrated electronic control unit shown in FIG. 1.
Figure 6:
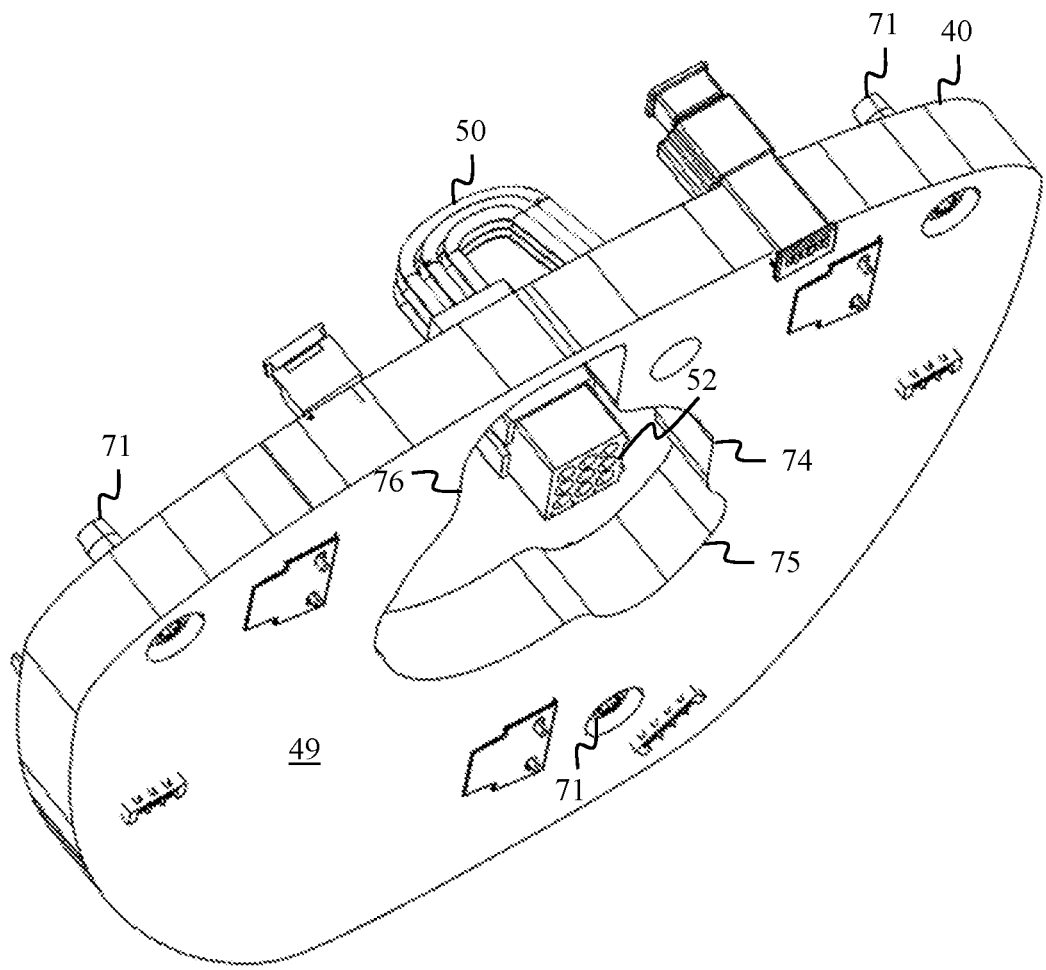
FIG. 6 is a rear perspective view of the integrated electronic control unit shown in FIG. 1.

FIGS. 5 and 6 show various views of the integrated electronic control unit 40. The ECU 40 includes a plurality of bosses 71 sized and arranged to align with the mounting holes 35 of the hub plate 30. In some implementations, the bosses 71 are threaded. During assembly, a screw, bolt, or other mechanical fastener (not shown) may be inserted through the mounting holes 35 from the first surface 38 of the hub plate 30 and threaded into the bosses 71 to securely attach the ECU 40 to the hub plate 30. Other means of attaching the ECU 40 to the hub plate 30 may be used. For example, one or more of the bosses 71 may be glued in the mounting holes 35 or the first surface 48 of the ECU 40 may be glued to the second surface 39 of the hub plate 30. In various implementations, the bosses 71 may not be threaded. Regardless, the ECU 40 is configured to be fixedly attached to the hub plate 30. While shown with the ECU 40 directly connected to the hub plate 30 (e.g., the first surface 48 of the ECU 40 contacts the second surface 39 of the hub plate 30), one or more intermediary components or other spacers may be present to provide physical separation between the first surface 48 and the second surface 39.

The ECU 40 includes a printed circuit board (PCB) with wire traces that electrically connect one or more of the electrical connectors 47 to the clock spring connector 50. For example, as shown in FIG. 5, a wire trace 72 electrically connects the electrical connector 47 to the clock spring connector 50. In the example shown in FIG. 5, the wire trace 72 provides a direct connection between the electrical connector 47 and the clock spring connector 50. While shown with a one-to-one correspondence between wire traces and electrical connectors 47, the PCB of the ECU may include one or more bus lines that connect to a plurality of the electrical connectors 47. While not shown, it is contemplated that one or more of the electrical connectors 47 may be connected to a wire trace that connects to another of the electrical connectors 47. For example, a connector for a thermistor may directly connect to a connector for a heater for controlling operation of a heater component connected thereto.

The PCB of the ECU 40 may also incorporate one or more processors that provide local processing and/or control via the electrical connectors 47. For example, a processor 73 is shown disposed along wire traces between a connector 67 and the clock spring connector 50.

The PCB of the ECU 40 may be an overmolded PCB using any appropriate electronics overmolding polymer. In some implementations, the PCB is encapsulated or encased within an enclosure, such as a polycarbonate or ABS enclosure.

The ECU 40 defines a plurality of apertures therethrough. The apertures of the ECU 40 include a first aperture 74 sized and arranged to allow the central portion of the hub plate 31 to pass therethrough when assembled with the hub plate 30. The apertures of the ECU 40 also include a second aperture 75 sized and arranged in line with the first aperture 32 of the hub plate 30 to receive the DAB squib lines therethrough. The apertures of the ECU 40 also include a third aperture 76 sized and arranged in line with the second aperture 33 of the hub plate 30. As with the second aperture 33 of the hub plate 30, the third aperture 76 of the ECU 40 is configured to align with a clock spring (not shown) on the steering column. The third aperture 76 of the ECU 40 is arranged to receive the clock spring connector 50 therethrough for connection with the clock spring. Specifically, the female connector 52 of the clock spring connector 50 is arranged to pass through the third aperture 76 of the ECU 40 to connect to the clock spring. While described above as distinct apertures, the apertures 74-76 of the ECU 40 may be formed as a single integral cavity as shown in FIGS. 5 and 6.

Each of the electrical connectors 47 described above extends from the first surface 48 of the ECU 40. In the example shown in FIGS. 5 and 6, one or more connection pins for the electrical connectors 47 extend in a direction perpendicular to the first surface 48 of the ECU 40. In some implementations, the ECU includes one or more right angle electrical connectors 77. The right-angle electrical connector 77 extends from the first surface 48 of the ECU 40, but includes one or more connection pins for the right-angle electrical connector 77 that extend in a direction parallel to the surface 48 of the ECU 40.

In some implementations, a ground connection area 78 is located about each of the bosses 71. The ground connection area 78 is electrically coupled to a ground of the ECU 40. In some implementations, the ground connection area 78 is formed by exposing a ground plane of the PCB of the ECU. In some implementations, the ground connection area 78 is formed from one or more wire traces that are electrically coupled to a ground of the ECU 40. Because of the placement of the ground connection area 78 about the bosses 71 on the first surface 48 of the ECU 40, upon assembly with the hub plate 30, the ground connection area 78 is placed in electrical contact with the second surface 39 of the hub plate 30. Accordingly, the ECU 40 is grounded to the hub plate 30. While shown as a circular area surrounding the bosses 71, the ground connection area 78 may be formed in any shape, such as square, triangular, oval, etc. The ground connection area 78 may fully surround, partially surround, or simply be adjacent to the bosses 71 sufficiently close for the ground connection area 78 to come into electrical contact with the second surface 39 of the hub plate 30. In some implementations, the ground connection area 78 may be located elsewhere on the first surface 48 insofar as the ground connection area 78 is placed in electrical contact with the hub plate 30 upon assembly.

Figure 7:
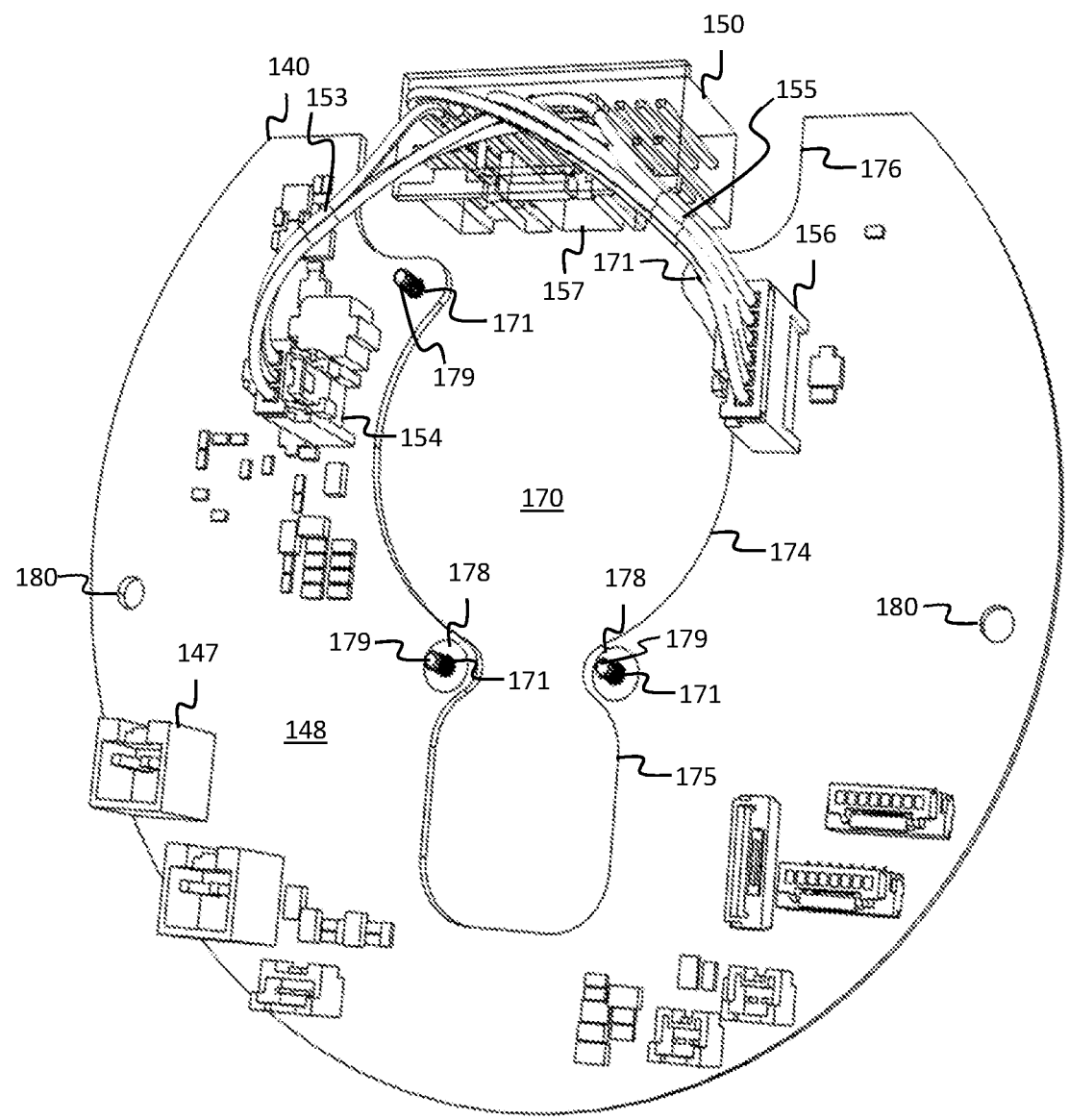
FIG. 7 is a front perspective view of an integrated electronic control unit with a clock spring connector cable according to another implementation.
Figure 8:
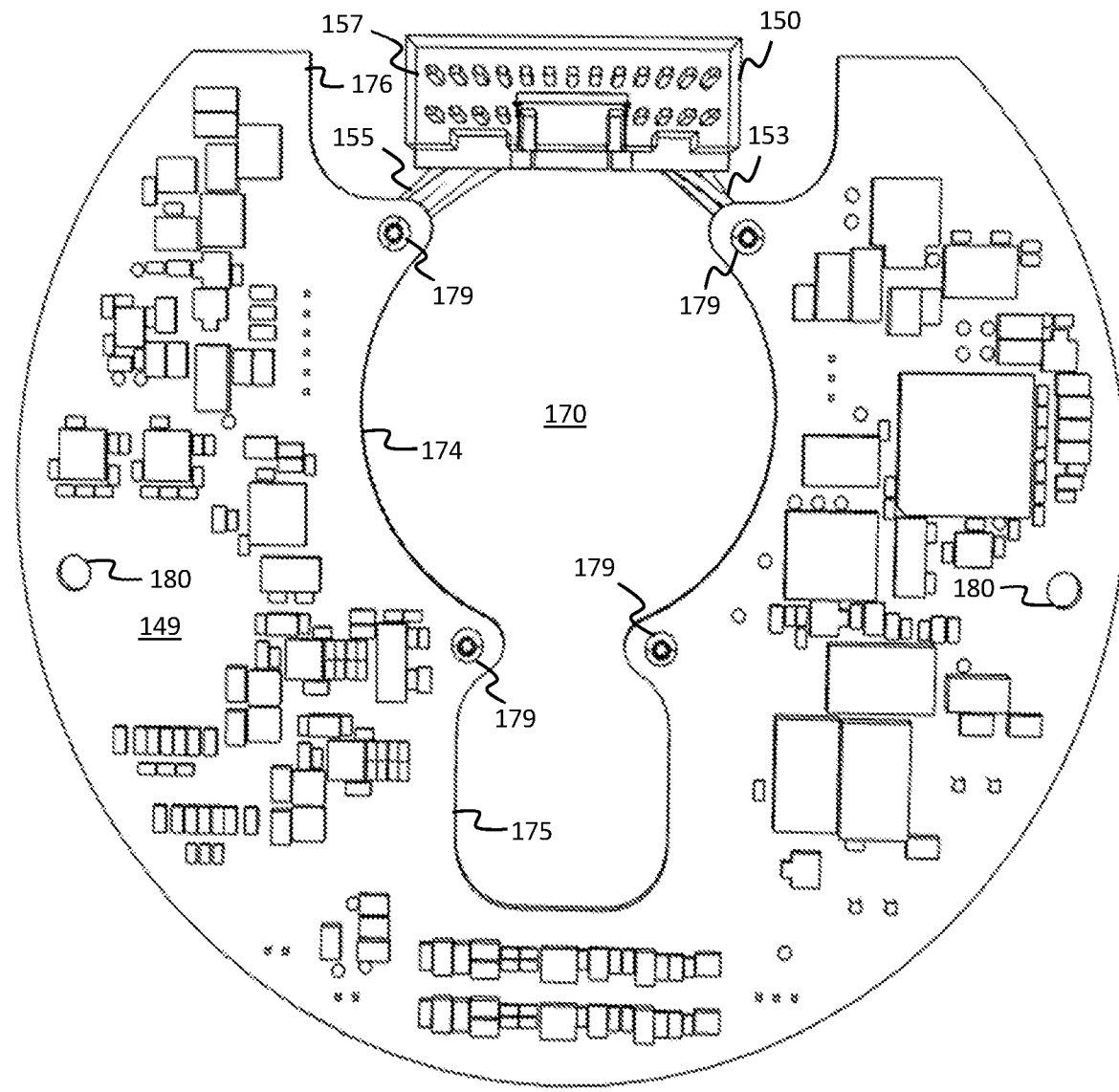
FIG. 8 is a rear view of the integrated electronic control unit with the clock spring connector cable according to the other implementation.
Figure 9:
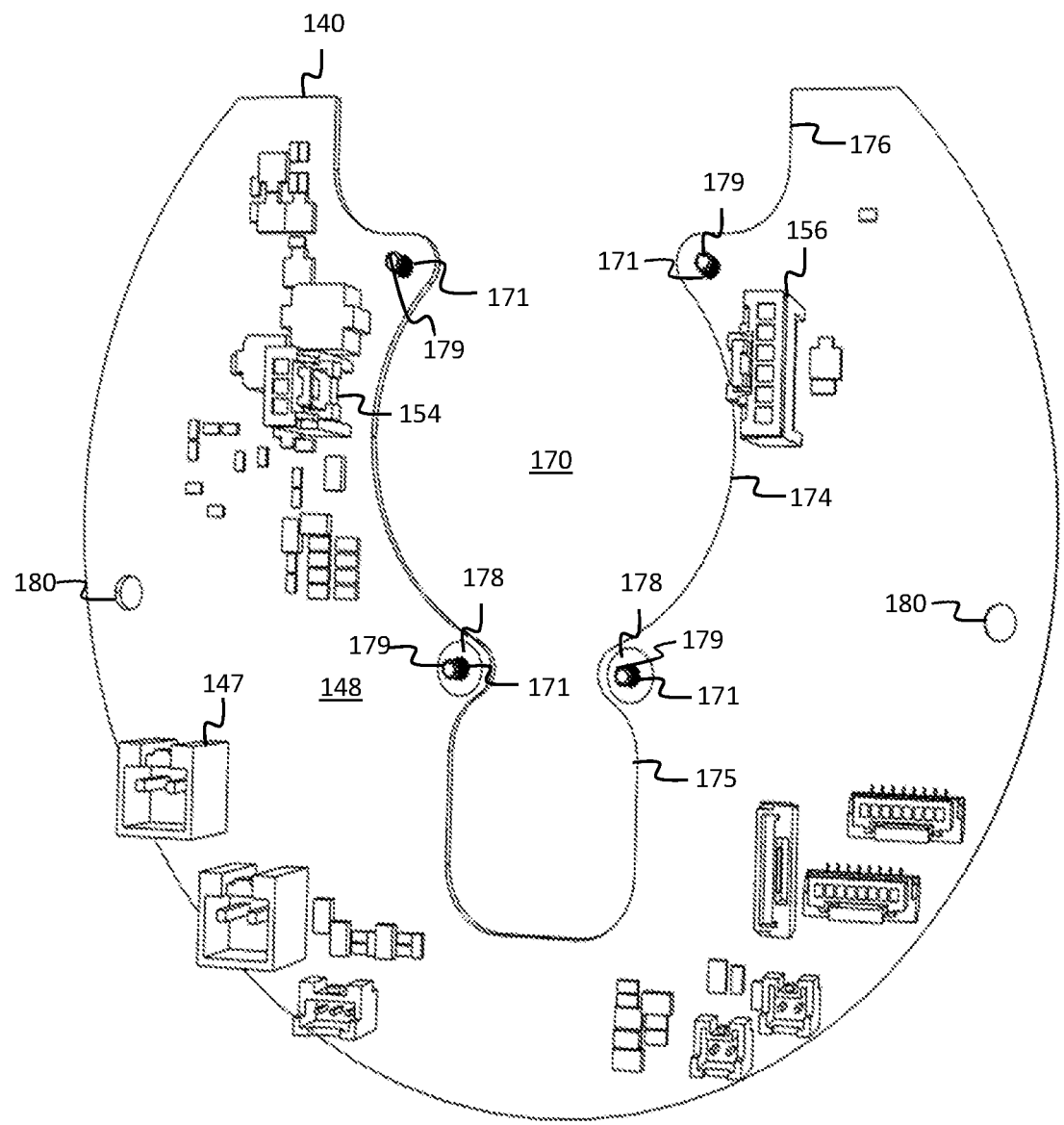
FIG. 9 is a front perspective view of an integrated electronic control unit shown in FIG. 7 without the clock spring connector cable.

FIGS. 7-9 show various views of an integrated electronic control unit according to another implementation. FIG. 7 is a front perspective view of an integrated electronic control unit (ECU) 140 with a clock spring connector cable 150 according to another implementation. FIG. 9 is a front perspective view of the ECU 140 shown in FIG. 7 without the clock spring connector cable 150.

In contrast to the ECU 40 described above, the ECU 140 does not include an integrated clock spring connector. Rather a separate clock spring connector cable 150 provides an electrical connection between the ECU 140 and a clock spring for a vehicle. The clock spring connector cable 150 comprises a first connector 153, a second connector 155, and a clock spring connector 157. The first connector 153, the second connector 155, and the clock spring connector 157 may each be a male or female connector. In some implementations, one or more of the first connector 153, the second connector 155, and the clock spring connector 157 may be a different type of connector (e.g., male or female) than the others. In various implementations, the first connector 153 comprises a first subset of the connections of the clock spring connector 157. Likewise, the second connector 155 comprises a second subset of the connections of the clock spring connector 157. The first and second subset of the connections of the clock spring connector 157 may together comprise all of the connections of the clock spring connector 157.

The first connector 153 is configured to be coupled to an ECU first connector 154 for facilitating data and/or power communication between the clock spring of a vehicle and the ECU 140. Likewise, the second connector 155 is configured to be coupled to an ECU second connector 156 for facilitating data and/or power communication between the clock spring of a vehicle and the ECU 140. One or more of the wires in either or both of the first connector 153 and the second connector 155 may carry data and/or power. The clock spring connector 157 is configured to be coupled to a clock spring of a vehicle for communicating data and power between the clock spring of the vehicle and the ECU 140.

As with the ECU 40, the ECU 140 includes a plurality of areas (not shown) that extend beyond a perimeter of the hub plate 30 when installed thereon. Each of the areas includes one or more electrical connectors 147. The electrical connectors 147 may include one or more of a vehicle cabin monitoring system connector, a light bar connector, a switch connector for connecting to a switch (not shown) on a steering wheel assembly, a hand sensor connector, a vibrational actuator connector, a microphone connector, a connector to one or more components of a hand sensor assembly, a lighted emblem connector, a heater connector, and/or a negative temperature coefficient (NTC) thermistor. The list of electrical connectors 147 is not intended to be exhaustive and other types of connectors for other electrical components of a steering wheel assembly may be used. More or fewer electrical connectors 147 may be used. As noted above, one or more electrical components may be integrated into the ECU 140, such as a horn switch.

Each of the electrical connectors 147, the ECU first connector 154, and the ECU second connector 156 extend from a first surface 148 of the ECU 140. The first surface 148 of the ECU 140 is configured to face a rear of a vehicle when installed therein (e.g., upon mounting to the hub plate 30). Similarly, a second surface 149 of the ECU 140 (best seen in FIG. 8) is opposite from the first surface 148 of ECU 140 and is configured to face a front of the vehicle when installed therein. In some implementations, the first surface 148 of the ECU 140 lies in a plane that is parallel to a plane in which the first surface 38 of the hub plate 30 lies. Likewise, in such implementations, the second surface 149 of the ECU 140 lies in a plane that is parallel to a plane in which the second surface 39 of the hub plate 30 lies.

In the example shown in FIGS. 7-9, one or more connection pins for the electrical connectors 147 extend in a direction perpendicular to the first surface 148 of the ECU 140. In some implementations, the ECU 140 includes one or more right angle electrical connectors (not shown). The right-angle electrical connector extends from the first surface 148 of the ECU 140, but includes one or more connection pins for the right-angle electrical connector that extend in a direction parallel to the surface 148 of the ECU 140.

As shown and described above with reference to FIG. 4, the first surface 38 of the hub plate 30 is located in a first plane 61 and the second surface 39 of the hub plate 30 is located in a second plane 62. Likewise, the first surface 148 of the ECU 140 is located in a third plane (not shown) and the second surface 149 of the ECU 40 is located in a fourth plane (not shown). Therefore, the first surface 148 of the ECU 140, which is located in the third plane, is disposed between the second plane 62, which includes the second surface 39 of the hub plate 30, and the front of a vehicle or a back cover (not shown) of a steering wheel assembly. Accordingly, the first surface 148 of the ECU 140 faces the second surface 39 of the hub plate 30. In other words, the first surface 148 of the ECU 140 is configured to be located towards a front of the vehicle from the first surface 38 of the hub plate 30, which in turn is configured to face towards a rear of a vehicle. The second plane 62 may be parallel to and coincident with the third plane. In other words, the first surface 148 of the ECU 140 is located towards the front of the vehicle from the first surface 38 of the hub plate 30, or the first surface 148 of the ECU 140 is configured to be coupled to the second surface 39 of the hub plate 30, which in turn is configured to face towards a front of the vehicle.

The ECU 140 includes a plurality of mounting holes 171 arranged to align with the mounting holes 35 of the hub plate 30 and sized to receive a corresponding screw 179. In some implementations, the mounting holes 35 of the hub plate 30 are threaded. In assembly, the screw 179 is passed through one of the mounting holes 171 and screwed into the threaded mounting hole of the hub plate 30 so as to securely attach the ECU 140 to the hub plate 30. While described above as a screw 179, other mechanical fasteners may be used, such as a bolt. Other means of attaching the ECU 140 to the hub plate 30 may be used. For example, one or more protrusions (not shown) or portions of the first surface 148 of the ECU 140 may be glued to the second surface 39 of the hub plate 30. Regardless, the ECU 140 is configured to be fixedly attached to the hub plate 30. While the ECU 140 may be directly connected to the hub plate 30 (e.g., the first surface 148 of the ECU 140 contacts the second surface 39 of the hub plate 30), one or more intermediary components or other spacers may be present to provide physical separation between the first surface 148 and the second surface 39.

The ECU 140 also includes back cover mounting holes 180 arranged to align with corresponding mounting holes (not shown) on the hub plate 30 or one or more of the spokes 20 of the steering wheel assembly 100. The back cover mounting holes 180 are sized to receive a corresponding screw for mounting a back cover (not shown) to the steering wheel assembly 100. In some implementations, a space is left between the second surface 149 of the ECU 140 and a screw head of the corresponding screw for receiving a portion of the back cover.

A ground connection area 178 is placed about one or more of the mounting holes 171. In the example shown in FIGS. 7-9, the ground connection area 178 is placed about two of the four mounting holes 171. The ground connection area 178 may be placed about more or fewer of the mounting holes 171. The ground connection area 178 may be placed on the first surface 148 and/or the second surface 149 of the ECU 140.

The ground connection area 178 is electrically coupled to a ground of the ECU 140. In some implementations, the ground connection area 178 is formed by exposing a ground plane of a PCB of the ECU. In some implementations, the ground connection area 178 is formed from one or more wire traces that are electrically coupled to a ground of the ECU 140. When placed on the first surface 148, upon assembly with the hub plate 30, the ground connection area 178 about the mounting holes 171 is placed in physical and electrical contact with the second surface 39 of the hub plate 30. When placed on the second surface 149, upon assembly with the hub plate 30, the ground connection area 178 about the mounting holes 171 is placed in electrical contact with the hub plate 30 via the screws 179. Accordingly, the ECU 40 is grounded to the hub plate 30. While shown as a circular area surrounding the mounting holes 171, the ground connection area 178 may be formed in any shape, such as square, triangular, oval, etc. The ground connection area 178 may fully surround, partially surround, or simply be adjacent to the mounting holes 171 sufficiently close for the ground connection area 178 to come into electrical contact with the hub plate 30 through direct physical contact with the second surface 39 of the hub plate 30 and/or via the screws 179. In some implementations, the ground connection area 178 may be located elsewhere on the first surface 148 insofar as the ground connection area 178 is placed in electrical contact with the hub plate 30 upon assembly.

The ECU 140 includes a printed circuit board (PCB) with wire traces that electrically connect each of the electrical connectors 147 to one of the ECU first connector 154 or the ECU second connector 156. For example, one or more wire traces may connect a corresponding number of pins of one of the electrical connectors 147 to the ECU first connector 154. Likewise, one or more wire traces may connect a corresponding number of pins of one of the electrical connectors 147 to the ECU second connector 156. In some examples, one or more of the electrical connectors 147 may only have wire traces that connect to either the ECU first connector 154 or the ECU second connector 156. In some examples, one or more of the electrical connectors 147 may have wire traces that connect to both the ECU first connector 154 and the ECU second connector 156. In various examples, the wire traces provide a direct connection from the electrical connector 147 to the ECU first connector 154 and/or the ECU second connector 156. However, the PCB of the ECU 140 may include wire traces for one or more bus lines that connect to a plurality of the electrical connectors 147. While not shown, it is contemplated that one or more of the electrical connectors 147 may be connected to a wire trace that connects to another of the electrical connectors 147. For example, a connector for a thermistor may directly connect to a connector for a heater for controlling operation of a heater component connected thereto.

As described above, the ECU 140 comprises a plurality of ECU connectors (e.g., the ECU first connector 154 and the ECU second connector 156) that connect to corresponding connectors (e.g., the first connector 153 and the second connector 155) on the clock spring connector cable 150. Each of the plurality of ECU connectors is coupled via wire traces on the PCB to a subset of the electrical connectors 147. Accordingly, one or more of the electrical connectors 147 may be electrically isolated from others of the electrical connectors 147 on the ECU 140 and have an independent and electrically isolated path to the clock spring connector 157.

The PCB of the ECU 140 may also incorporate one or more processors (not shown) that provide local processing and/or control via the electrical connectors 147. The one or more processors may in turn be connected to each of the ECU first connector 154 and the ECU second connector 156.

The PCB of the ECU 140 may be an overmolded PCB using any appropriate electronics overmolding polymer. In some implementations, the PCB is encapsulated or encased within an enclosure, such as a polycarbonate or ABS enclosure.

The ECU 140 defines a central aperture 170 therethrough so as to take on a generally horseshoe or "U" shape. The central aperture 170 of the ECU 140 includes a first aperture area 174 sized and arranged to allow the central portion of the hub plate 31 to pass therethrough when assembled with the hub plate 30. The first aperture area 174 is a generally circular aperture area and positioned in a central location of the ECU 140. The central aperture 170 of the ECU 140 also include a second aperture area 175 sized and arranged to receive DAB squib lines therethrough. The second aperture area 175 is a generally square or rectangular shape. The central aperture 170 of the ECU 140 also include a third aperture area 176 sized and arranged in line with a clock spring on the steering column of a vehicle. The third aperture area 176 of the ECU 140 is arranged to receive the clock spring connector 157 therethrough for connection with the clock spring.

As shown, the first aperture area 174, the second aperture area 175, and the third aperture area 176 are arranged in line to form the central aperture 170 as an integral cavity. The third aperture area 176 is arranged on a first side of the centrally located first aperture area 174 and configured to be aligned with a clock spring on the steering column of a vehicle. The second aperture area 175 is arranged on a second side of the centrally located first aperture area 174, opposite from the first side of the centrally located first aperture area 174.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A vehicle steering wheel assembly comprising:
   a steering wheel structural frame having a rim and a hub plate located centrally to the rim, the hub plate having a first surface facing a rear of the vehicle and a second surface facing a front of the vehicle; and
   an electronic control unit having a first surface facing the rear of the vehicle, wherein the first surface of the electronic control unit is located in a plane that is disposed between a second plane that includes the second surface of the hub plate and the front of the vehicle,
   wherein an electrical connector extends from the first surface of the electronic control unit towards the first surface of the hub plate.

2. The assembly of claim 1, wherein the electronic control unit comprises a clock spring connector electrically coupled to the electrical connector.

3. The assembly of claim 2, wherein the clock spring connector is electrically coupled to the electrical connector via a processor on the electronic control unit.

4. The assembly of claim 2, wherein the clock spring connector is electrically coupled to the electrical connector via a wire trace.

5. The assembly of claim 2, wherein the electronic control unit comprises a printed circuit board with the electrical connector and the clock spring connector.

6. The assembly of claim 2, wherein the clock spring connector extends from the first surface of the electronic control unit towards the first surface of the hub plate.

7. The assembly of claim 6, wherein the electronic control unit comprises an aperture, wherein the clock spring connector is arranged to pass through the aperture towards a second surface of the electronic control unit.

8. The assembly of claim 7, wherein the hub plate comprises a second aperture in alignment with the aperture, and wherein the clock spring connector is further arranged to pass through the second aperture.

9. The assembly of claim 1, wherein the first surface of the electronic control unit is coupled to the second surface of the hub plate.

10. The assembly of claim 1, wherein the electrical connector extends from the first surface of the electronic control unit at a location beyond a perimeter of the hub plate.

11. The assembly of claim 1, wherein the electrical connector extends from the first surface of the electronic control unit at a location in alignment with an opening defined by the hub plate.

12. The assembly of claim 1, wherein the first surface of the electronic control unit faces the second surface of the hub plate.

13. The assembly of claim 1, wherein a connection pin of the electrical connector extends in a direction parallel to the first surface of the electronic control unit.

14. The assembly of claim 1, wherein the electronic control unit comprises a plurality of connectors configured to be coupled to an external clock spring connector.

15. An electronic control unit for a steering wheel assembly, comprising:
    a printed circuit board defining an aperture extending therethrough;
    an electrical connector that extends from a first surface of the printed circuit board; and
    a clock spring connector electrically coupled to the electrical connector by the printed circuit board, wherein the clock spring connector extends from a first surface of the printed circuit board and passes through the aperture.

16. The electronic control unit of claim 15, wherein the printed circuit board further comprises a boss extending from the first surface of the printed circuit board.

17. The electronic control unit of claim 16, wherein the boss is sized to be received by a mounting hole defined by a hub plate of the steering wheel assembly.

18. The electronic control unit of claim 15, wherein the printed circuit board is sized to include a portion of the first surface that extends beyond a perimeter of a hub plate of the steering wheel assembly when mounted thereto, and wherein the electrical connector is positioned on the portion of the first surface of the printed circuit board.

19. The electronic control unit of claim 17, wherein the printed circuit board further comprises a ground connection area about the boss for electrical connection with the hub plate upon assembly.

20. An electronic control unit for a steering wheel assembly, comprising:
- a printed circuit board defining an aperture extending therethrough;
- an electrical connector that extends from a first surface of the printed circuit board;
- a plurality of connectors that extend from the first surface of the printed circuit board and are configured to receive power and/or data from a clock spring connector, wherein the electrical connector is electrically coupled to one of the plurality of connectors by the printed circuit board, wherein the aperture comprises a first aperture area arranged to be aligned with a clock spring of a vehicle, wherein the printed circuit board further comprises a boss extending from the first surface of the printed circuit board, wherein the boss is sized to be received by a mounting hole defined by a hub plate of the steering wheel assembly.

* * * * *